(12) United States Patent
Yamaguchi et al.

(10) Patent No.: US 8,269,402 B2
(45) Date of Patent: Sep. 18, 2012

(54) BNT-BKT-BT PIEZOELECTRIC COMPOSITION, ELEMENT AND METHODS OF MANUFACTURING

(75) Inventors: Hirofumi Yamaguchi, Komaki (JP); Shuichi Ozawa, Nagoya (JP); Yuji Noguchi, Tokyo (JP); Masaru Miyayama, Tokyo (JP)

(73) Assignees: NGK Insulators, Ltd., Nagoya-Shi (JP); The University of Tokyo, Bunkyo-Ku (JP)

( * ) Notice: Subject to any disclaimer, the term of this patent is extended or adjusted under 35 U.S.C. 154(b) by 446 days.

(21) Appl. No.: 12/618,925

(22) Filed: Nov. 16, 2009

(65) Prior Publication Data

US 2010/0123370 A1 May 20, 2010

(30) Foreign Application Priority Data

Nov. 18, 2008 (JP) .................. 2008-294381
Nov. 9, 2009 (JP) .................. 2009-256237

(51) Int. Cl.
*H01L 41/187* (2006.01)

(52) U.S. Cl. ............ 310/358; 501/134; 252/62.9 PZ; 257/347

(58) Field of Classification Search ............ 310/358; 501/134; 252/62.9 R, 62.9 PZ
See application file for complete search history.

(56) References Cited

U.S. PATENT DOCUMENTS

| | | | |
|---|---|---|---|
| 7,090,785 B2 * | 8/2006 | Chiang et al. | 252/62.9 R |
| 2003/0001131 A1 * | 1/2003 | Takase et al. | 252/62.9 R |
| 2006/0279178 A1 | 12/2006 | Ren | |
| 2011/0234044 A1 * | 9/2011 | Noguchi et al. | 310/311 |
| 2011/0254899 A1 * | 10/2011 | Sakai | 347/68 |
| 2011/0254901 A1 * | 10/2011 | Sakai | 347/71 |

FOREIGN PATENT DOCUMENTS

| JP | 2004-363557 A1 | 12/2004 |
|---|---|---|
| JP | 2006-137654 A1 | 6/2006 |

OTHER PUBLICATIONS

Teranishi et al., "Giant-Strain Characteristics in $(Bi_{0.5}Na_{0.5})TiO_3$-based Ferroelectric Substance," *Preliminary Manuscript of 46th Symposium on Basic Science of Ceramics*, The Ceramic Society of Japan, Division of Basic Science, Jan. 2008, pp. 482-483.

\* cited by examiner

*Primary Examiner* — Jaydi San Martin
(74) *Attorney, Agent, or Firm* — Burr & Brown

(57) ABSTRACT

Piezoelectric/electrostrictive ceramics having the composition represented by the general formula: xBNT-yBKT-zBT (x+y+z=1) are provided, wherein at least one kind among A-site elements are allowed to become deficient from stoichiometry in which a point (x, y, z) representing content ratios x, y and z of $(Bi1/2Na1/2)TiO3$, $(Bi1/2K1/2)TiO3$ and $BaTiO3$ is within a range including a border line of a quadrangle ABCD with a point A, a point B, a point C and a point D as vertices in a ternary phase diagram. Vacancies are formed in an A-site of a perovskite structure by allowing the A-site elements to become deficient from stoichiometry. An amount of A-site vacancies becomes at least 2 mol % to at most 6 mol %.

5 Claims, 8 Drawing Sheets

A(0.93, 0.00, 0.07)
B(0.86, 0.00, 0.14)
C(0.74, 0.20, 0.06)
D(0.80, 0.20, 0.00)
E(0.98, 0.00, 0.02)
F(0.80, 0.00, 0.20)
G(0.68, 0.24, 0.08)
H(0.76, 0.24, 0.00)
X(0.81, 0.14, 0.05)

A(0.93, 0.00, 0.07)    E(0.98, 0.00, 0.02)
B(0.86, 0.00, 0.14)    F(0.80, 0.00, 0.20)
C(0.74, 0.20, 0.06)    G(0.68, 0.24, 0.08)
D(0.80, 0.20, 0.00)    H(0.76, 0.24, 0.00)
                       X(0.81, 0.14, 0.05)

F I G. 1 0
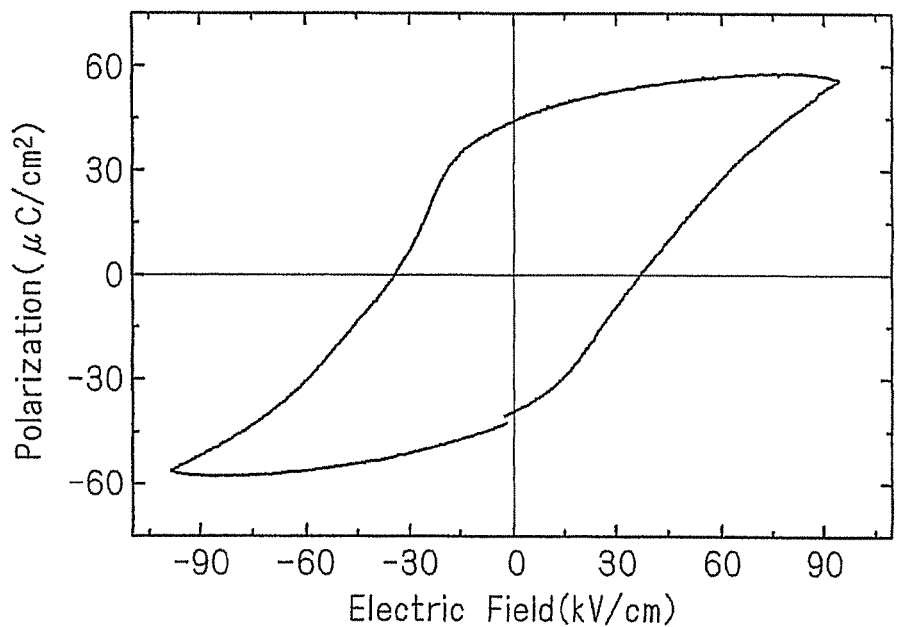
F I G. 1 1
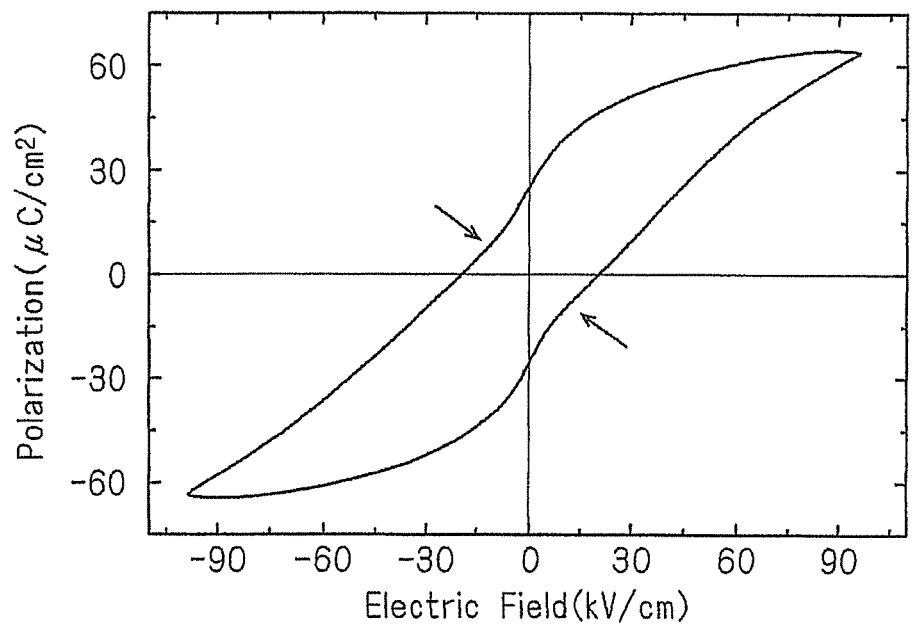

BNT-BKT-BT PIEZOELECTRIC COMPOSITION, ELEMENT AND METHODS OF MANUFACTURING

FIELD OF THE INVENTION

The present invention relates to a sodium bismuth titanate-based piezoelectric/electrostrictive ceramic composition and a technology in relation to the same.

BACKGROUND OF THE INVENTION

A piezoelectric/electrostrictive actuator has such an advantage that a displacement can be accurately controlled in a submicron order. Particularly, a piezoelectric/electrostrictive actuator using a sintered body of piezoelectric/electrostrictive ceramics as a piezoelectric/electrostrictive body can accurately control a displacement, and also has advantages such as high electromechanical conversion efficiency, a large generation force, a high response speed, high durability and less power consumption. Therefore, the piezoelectric/electrostrictive actuator using the sintered body of piezoelectric/electrostrictive ceramics as the piezoelectric/electrostrictive body is employed as a head of an inkjet printer, an injector of a diesel engine and so on utilizing these advantages.

As the sintered body of piezoelectric/electrostrictive ceramics for a piezoelectric/electrostrictive actuator, a lead zirconate titanate (hereinafter referred to as "PZT")-based leaded piezoelectric/electrostrictive material has hitherto been used. However, ever since an influence of lead from a sintered body on the global environment came to be strongly feared, it has also been studied to use a lead-free piezoelectric/electrostrictive material such as a sodium bismuth titanate (hereinafter referred to as "BNT")-based material.

In a BNT-based lead-free piezoelectric/electrostrictive material, there was made a trial of increasing an electric field-induced strain, which is important for a piezoelectric/electrostrictive actuator, by solid-dissolving bismuth potassium titanate (hereinafter referred to as "BKT") or barium titanate (hereinafter referred to as "BT") in BNT. However, it is difficult to obtain a large electric field-induced strain, which is equivalent to that of a PZT-based leaded piezoelectric/electrostrictive material, only by the above method.

Therefore, trials for obtaining a larger electric field-induced strain by introducing defects into a crystal have been made.

For example, Non-Patent Document 1 describes that a large electric field-induced strain is obtained by introducing defects into a single crystal of BNT-BKT-BT, which is a solid solution of BNT, BKT and BT.

Patent Documents 1 and 2 describe that a large electric field-induced strain is obtained by substituting a portion of constituent elements with a donor or an acceptor and introducing defects having the same symmetry as that of a crystal into a single crystal or ceramics through an aging treatment for 5 days to 3 months.

PRIOR ART DOCUMENTS

Non-Patent Document

[Non-Patent Document 1] Teranishi and other six persons, "Giant-Strain Characteristics in $(Bi_{0.5}Na_{0.5})TiO_3$-based Ferroelectric Substance", Preliminary Manuscript of 46th Symposium on Basic Science of Ceramics, The Ceramic Society of Japan, Division of Basic Science, January 2008, pp. 482-483

Patent Documents

[Patent Document 1] Japanese Patent Application Laid-Open No. 2004-363557
[Patent Document 2] Japanese Patent Application Laid-Open No. 2006-137654

SUMMARY OF THE INVENTION

Problems to be Solved by the Invention

Since a growing temperature of a BNT-based single crystal is as high as at least 1300° C., it is difficult to control the concentration of easily volatilizable components such as Bi (bismuth) and K (potassium) in the production of a BNT-based single crystal. Therefore, in the BNT-based single crystal, the composition of starting materials upon mixing is different from that of the grown single crystal. This means that it is difficult to control the amount of defects which has a close correlation with the magnitude of an electric field-induced strain.

There is also a problem that it is difficult to process a single crystal into a film shape suited for a piezoelectric/electrostrictive body to be used in a piezoelectric/electrostrictive actuator since there is a restriction on processing of a single crystal.

Taking these facts into consideration, it is desired to use, as the piezoelectric/electrostrictive body of the piezoelectric/electrostrictive actuator, a sintered body of ceramics as compared with the single crystal described in Non-Patent Document 1. However, since a hetero-phase is likely to be precipitated on crystal grain boundaries in the sintered body of piezoelectric/electrostrictive ceramics, it is impossible to directly apply findings with respect to the single crystal obtained by Non-Patent Document 1 to piezoelectric/electrostrictive ceramics.

Therefore, findings with respect to induction of defects into piezoelectric/electrostrictive ceramics are required. However, induction of defects into piezoelectric/electrostrictive ceramics by the techniques of Patent Documents 1 and 2 is not suited for industrial production since an aging treatment requires a long period.

The present invention has been made so as to solve these problems and a first object thereof is to provide piezoelectric/electrostrictive ceramics with a large electric filed-induced strain without performing an aging treatment. A second object thereof is to provide a piezoelectric/electrostrictive element with a large displacement without performing an aging treatment.

Means for Solving the Problems

In order to achieve the above objects, as the composition of piezoelectric/electrostrictive ceramics, there was employed a composition represented by the general formula: $x(Bi_{1/2}Na_{1/2})TiO_3$-$y(Bi_{1/2}K_{1/2})TiO_3$-$zBaTiO_3$ wherein at least one kind among Bi, Na and K as A-site elements is allowed to become deficient from stoichiometry in which a point (x, y, z) representing content ratios x, y and z of $(Bi_{1/2}Na_{1/2})TiO_3$, $(Bi_{1/2}K_{1/2})TiO_3$ and $BaTiO_3$ is within a range (also including a border line) of a quadrangle ABCD with a point A (x=0.93, y=0, z=0.07), a point B (x=0.86, y=0, z=0.14), a point C (x=0.74, y=0.20, z=0.06) and a point D (x=0.80, y=0.20, z=0.00) as vertices in a ternary phase diagram, and thus vacancies are formed in the A-site of a perovskite structure.

A stoichiometrically deficient amount of the A-site elements is at least 2 mol % to at most 6 mol %, and an amount of A-site vacancies of the perovskite structure is at least 2 mol % to at most 6 mol %.

Effects of the Invention

According to one aspect of the present invention, piezoelectric/electrostrictive ceramics with a large electric field-induced strain can be provided without performing an aging treatment.

According to another aspect of the present invention, a piezoelectric/electrostrictive element with a large displacement can be provided without performing an aging treatment.

BRIEF DESCRIPTION OF THE DRAWINGS

FIG. 10 is a graph showing a polarization change to an electric field when an AC electric field is applied to a sample X1;

FIG. 1*l* is a graph showing a polarization change to an electric field when an AC electric field is applied to a sample X3;

DETAILED DESCRIPTION OF INVENTION

These and other objects, features, aspects and advantages of the present invention will become more apparent with reference to the following detailed description along with the accompanied drawings.

<1. First Embodiment>

A first embodiment relates to piezoelectric/electrostrictive ceramics.

<1.1 Composition>

Figure 1:
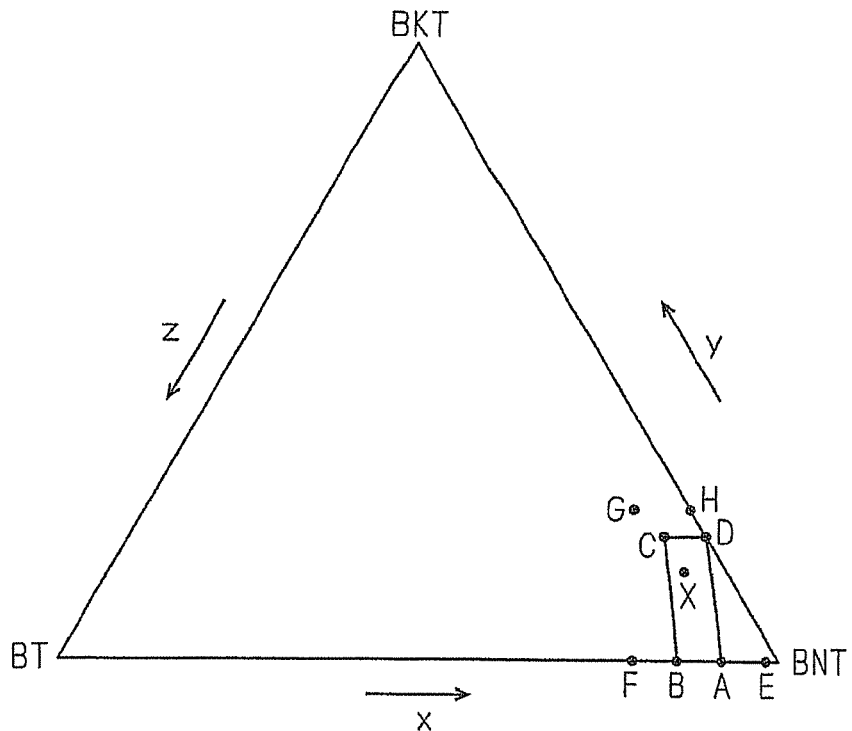
FIG. 1 is a diagram showing a ternary phase diagram for explaining a desired composition range of piezoelectric/electrostrictive ceramics according to a first embodiment.

FIG. 1 is a diagram showing a desired composition range of the piezoelectric/electrostrictive ceramics according to the first embodiment. FIG. 1 is a three component-based ternary phase diagram of sodium bismuth titanate ($(Bi_{1/2}Na_{1/2})TiO_3$, hereinafter referred to as "BNT"), bismuth potassium titanate ($(Bi_{1/2}K_{1/2})TiO_3$, hereinafter referred to as "BKT") and barium titanate ($BaTiO_3$, hereinafter referred to as "BT").

The piezoelectric/electrostrictive ceramics according to the first embodiment have the composition represented by the general formula: xBNT-yBKT-zBT (x+y+z=1) wherein at least one kind among Bi (bismuth), Na (sodium) and K (potassium) as A-site elements is allowed to become deficient from stoichiometry in which a point (x, y, z) representing content ratios x, y and z of BNT, BKT and BT is within a range (also including a border line) of a quadrangle ABCD with a point A (x=0.93, y=0, z=0.07), a point B (x=0.86, y=0, z =0.14), a point C (x=0.74, y=0.20, z=0.06) and a point D (x=0.80, y=0.20, z=0.00) as vertices in a ternary phase diagram shown in FIG. 1. A stoichiometrically deficient amount of the A-site elements is at least 2 mol % to at most 6 mol%. When there are two or more kinds of elements which are allowed to become deficient from stoichiometry, there is no limitation on the combination of the elements which are allowed to become deficient.

The composition of the piezoelectric/electrostrictive ceramics according to the first embodiment can also be represented by the general formula:

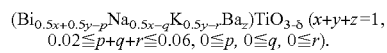

$(Bi_{0.5x+0.5y-p}Na_{0.5x-q}K_{0.5y-r}Ba_z)TiO_{3-\delta}$ (x+y+z=1, $0.02 \leq p+q+r \leq 0.06$, $0 \leq p$, $0 \leq q$, $0 \leq r$).

The piezoelectric/electrostrictive ceramics according to the first embodiment may contain slight impurities.

The content ratios x, y and z of BNT, BKT and BT are adjusted to the above range because an electric field-induced strain tends to decrease when the content ratios deviate from the above range (not including border line). When the content ratio y of BKT exceeds a line CD connecting the point C and the point D of the ternary phase diagram shown in FIG. 1, a leak current tends to increase.

The stoichiometrically deficient amount of the A-site elements was adjusted to the above range because an electric field-induced strain tends to decrease when the stoichiometrically deficient amount is less than the above range, and also the electric field-induced strain tends to decrease and the leak current tends to increase when the stoichiometrically deficient amount is more than the above range.

<1.2 Crystal>

The piezoelectric/electrostrictive ceramics according to the first embodiment includes BNT-BKT—BT, which is a solid solution of BNT, BKT and BT, and the crystal structure is a perovskite structure. The piezoelectric/electrostrictive ceramics according to the first embodiment may contain a slight hetero-phase.

The line AD connecting the point A and the point D of the ternary phase diagram shown in FIG. 1 exists in the vicinity of a morphotropic phase boundary between a tetragonal phase with a space group of P4 mm and a rhombohedral phase with a space group of R3C. In the range of a quadrangle ABCD, a crystal system of the solid solution BNT-BKT-BT is composed of a tetragonal phase as a main phase. A crystal system composed of a tetragonal phase having lattice anisotropy contributes to an increase in the electric field-induced strain due to non-180° domain switching.

As described above, when the A-site elements are allowed to become deficient from stoichiometry, vacancies are formed in the A-site of a perovskite structure. The amount of A-site vacancies is at least 2 mol % to at most 6 mol %.

<1.3 Domain Switching>

As described above, formation of A-site vacancies enables easy occurrence of domain switching and contributes to the occurrence of a large electric field-induced strain caused by rotation of a non-180° domain. In the case where rotation of a non-180° domain is likely to occur, when an AC electric field is applied, there is observed a jump phenomenon in which the strain and polarization rapidly nonlinearly increase in a certain electric field. Specific examples thereof are mentioned in the following "Examples".

<1.4 Production>

Figure 2:
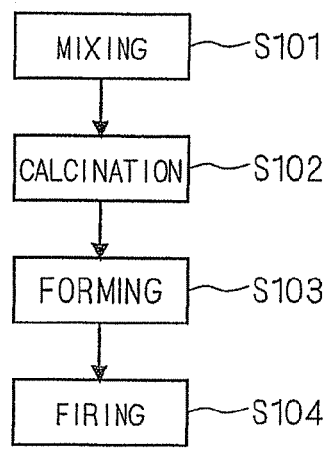
FIG. 2 is a flow chart for explaining a production flow of the piezoelectric/electrostrictive ceramics according to the first embodiment.

FIG. 2 is a flow chart for explaining a production flow of the piezoelectric/electrostrictive ceramics according to the first embodiment.

(a) Mixing (Step S101)

First, starting materials of constituent elements (Bi, Na, K, Ba, Ti) weighed so as to have the above composition are mixed. As the starting materials, an oxide or compounds such as a carbonate, a tartrate or an oxalate, which are finally converted into oxides, are used. Mixing is performed by a ball mill and so on. When mixing is performed by a ball mill, an organic solvent such as ethanol, toluene or acetone is used as a dispersion medium, while removal of the dispersion medium from the slurry is performed by evaporation and drying, filtration, centrifugal separation, or the like. Mixing may be performed by a dry method in place of a wet method.

(b) Calcination (Step S102)

After mixing the starting materials, the resulting mixed materials are reacted by calcination. The calcination temperature is preferably from 800 to 1000° C. The time of maintaining a maximum temperature is preferably from 2 to 10 hours.

In order to adjust the particle diameter and the specific surface area, the resultant powder may be pulverized. In this case, calcination and pulverization may be repeated twice or more times. In order to adjust the particle diameter distribution, the resultant powder may be classified. Furthermore, in order to adjust the shape and the particle diameter of secondary particles, a slurry of the resultant powder may be subjected to a granulation treatment such as spray drying.

(c) Forming (Step S103)

After calcining the mixed materials, the resultant powder is formed. Forming is performed by extrusion molding, injection molding, press molding, slip casting, tape casting, or cold isostatic press (CIP) molding. CIP molding may be performed after performing pressmolding. Prior to the forming, the powder may be mixed with a binder. When the powder is mixed with a binder, a polyvinylbutyral resin, a polyvinyl alcohol resin, a polyvinyl acetate resin or a polyacrylic resin is used as the binder.

(d) Firing (Step S104)

After forming the powder, the resulting formed body is fired. The firing temperature is preferably from 1100 to 1200° C. The time of maintaining a maximum temperature is preferably from 2 to 10 hours. When the powder is mixed with a resin binder, a heat treatment for removing the resin binder from the formed body is preferably performed. The resulting sintered body may be subjected to a processing such as cutting, grinding or polishing. Prior to firing, an electrode film may be formed on a surface of the formed body, followed by co-firing of the formed body and the electrode film.

(e) Others

When the resulting sintered body is used for a piezoelectric/electrostrictive actuator and an electric field more than the coercive electric field is applied, it is not necessarily required to subject the resulting sintered body to a polarization treatment. However, this description does not interfere with a polarization treatment of the resulting sintered body.

It is not essential that the starting materials of all the constituent elements are reacted at a time as described above, and the starting materials may be reacted by two or more portions. For example, after synthesizing intermediates such as BNT, BKT and BT, a solid solution BNT-BKT-BT may be synthesized by reacting the intermediates. The solid solution BNT-BKT-BT or the intermediates may also be synthesized by a method other than a solid phase reaction method such as an alkoxide method.

<1.5 Use Applications>

The sintered body of the piezoelectric/electrostrictive ceramics of the first embodiment is suitably used for a piezoelectric/electrostrictive actuator because of a large electric field-induced strain obtained when a large electric field is applied. However, this description does not interfere with the use of the sintered body of the piezoelectric/electrostrictive ceramics of the first embodiment for other piezoelectric/electrostrictive elements, for example, a resonator and a sensor. As a matter of course, when the sintered body of the piezoelectric/electrostrictive ceramics is used for a resonator or a sensor and an electric field more than the coercive electric field is not applied, the resulting sintered body is subjected to a polarization treatment.

<2. Second Embodiment>

The second embodiment relates to a piezoelectric/electrostrictive actuator 402 using the piezoelectric/electrostrictive ceramics of the first embodiment.

<2.1 Overall Structure>

Figure 3:
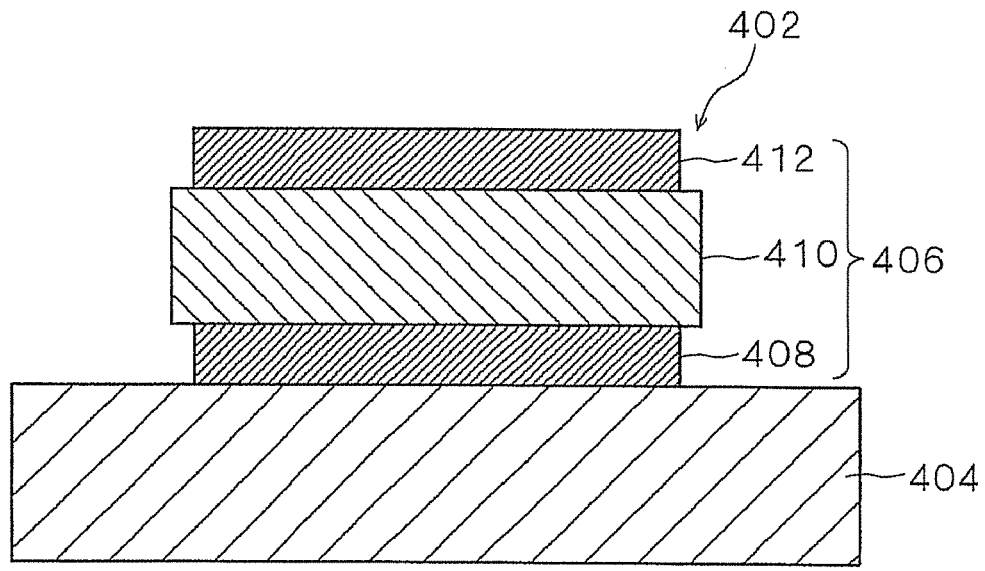
FIG. 3 is a sectional view of a piezoelectric/electrostrictive actuator according to a second embodiment.

FIG. 3 is a schematic view of the piezoelectric/electrostrictive actuator 402 of the second embodiment. FIG. 3 is a sectional view of a single-layered piezoelectric/electrostrictive actuator 402.

As shown in FIG. 3, the piezoelectric/electrostrictive actuator 402 has a structure in which an electrode film 408, a piezoelectric/electrostrictive film 410 and an electrode film 412 are laminated in this order on a top surface of a substrate 404. The electrode films 408 and 412 on both main surfaces of the piezoelectric/electrostrictive film 410 face each other across the piezoelectric/electrostrictive film 410. A laminate 406 in which the electrode film 408, the piezoelectric/electrostrictive film 410 and the electrode film 412 are laminated is fixed to the substrate 404.

"Fixation" as used herein means that the laminate 406 is bonded to the substrate 404 by a solid phase reaction at an interface between the substrate 404 and the laminate 406 without using an organic adhesive or an inorganic adhesive.

In the piezoelectric/electrostrictive actuator 402, when a voltage is applied, the piezoelectric/electrostrictive film 410 is expanded and contracted in a direction perpendicular to the electric field according to the applied voltage and, as a result, a bending displacement arises.

<2.2 Piezoelectric/Electrostrictive Film 410>

The piezoelectric/electrostrictive film 410 is constituted using the sintered body of the piezoelectric/electrostrictive ceramics of the first embodiment.

The film thickness of the piezoelectric/electrostrictive film 410 is preferably from 0.5 to 50 μm, more preferably from 0.8 to 40 μm, and particularly preferably from 1 to 30 μm. When the film thickness is smaller than the above range, densification tends to become insufficient. In contrast, when the film thickness is larger than the above range, since shrinkage stress during sintering increases, the board thickness of the substrate 404 has to be increased and miniaturization of the piezoelectric/electrostrictive actuator 402 becomes difficult.

<2.3 Electrode Films 408 and 412>

The material of the electrode films 408 and 412 is a metal such as platinum, palladium, rhodium, gold or silver, or an alloy thereof. Among these materials, platinum or an alloy containing platinum as a main component is preferred in view of high heat resistance during firing. Depending on the firing temperature, an alloy such as silver-palladium can also be suitably used.

The film thickness of the electrode films 408 and 412 is preferably at most 15 μm and more preferably at most 5 μm. When the film thickness is larger than the above range, the electrode films 408 and 412 serve as relaxing layers and a bending displacement tends to decrease. In order to make the electrode films 408 and 412 properly fulfill the role, the film thickness is preferably at least 0.05 μm.

It is preferred that the electrode films 408 and 412 are formed so as to cover a region which substantially contributes to the bending displacement of the piezoelectric/electrostrictive film 410. For example, it is preferred to form the electrode films 408 and 412 so as to include the center portion of the piezoelectric/electrostrictive film 410 and to cover at least 80% of both main surfaces of the piezoelectric/electrostrictive film 410.

<2.4 Substrate 404>

Although the substrate 404 is made of ceramics, there is no limitation on the kind of the material. In view of heat resistance, chemical stability and insulating properties, ceramics containing at least one kind selected from the group consisting of stabilized zirconium oxide, aluminum oxide, magnesium oxide, mullite, aluminum nitride, silicon nitride and glass are preferred. Among these, stabilized zirconium oxide is more preferred in view of the mechanical strength and toughness. The term "stabilized zirconium oxide" as used herein means zirconium oxide in which phase transition of a crystal is suppressed by the addition of a stabilizer and includes, in addition to stabilized zirconium oxide, partially stabilized zirconium oxide.

Examples of stabilized zirconium oxide include zirconium oxide containing 1 to 30 mol % of calcium oxide, magnesium oxide, yttrium oxide, ytterbium oxide or cerium oxide, or an oxide of a rare earth metal as a stabilizer. Among these, zirconium oxide containing yttrium oxide as the stabilizer is preferred in view of particularly high mechanical strength. The content of yttrium oxide is preferably from 1.5 to 6 mol %, and more preferably from 2 to 4 mol %. It is more preferred that zirconium oxide contains, in addition to yttrium oxide, 0.1 to 5 mol % of aluminum oxide. The crystal phase of the stabilized zirconium oxide may be a mixed crystal of a cubic crystal and a monoclinic crystal, a mixed crystal of a tetragonal crystal and a monoclinic crystal, or a mixed crystal of a cubic crystal, a tetragonal crystal and a monoclinic crystal. In view of the mechanical strength, toughness and durability, a main crystal phase is preferably a mixed crystal of a tetragonal crystal and a cubic crystal, or a tetragonal.

The board thickness of the substrate 404 is preferably from 1 to 1,000 μm, more preferably from 1.5 to 500 μm, and particularly preferably from 2 to 200 μm. When the board thickness is smaller than the above range, the mechanical strength of the piezoelectric/electrostrictive actuator 402 tends to decrease. In contrast, when the board thickness is larger than the above range, the rigidity of the substrate 404 increases and the bending displacement due to the expansion and contraction of the piezoelectric/electrostrictive film 410 upon application of a voltage tends to decrease.

The surface shape (shape of the surface to which the laminate 406 is fixed) of the substrate 404 is not particularly limited, and may be triangle, quadrangle (rectangle or square), oval or circle, and a triangle and a quadrangle may be subjected to chamfering. The surface shape may be a combined shape of these basic shapes.

<2.5 Production of Piezoelectric/Electrostrictive Actuator 402>

In the production of the piezoelectric/electrostrictive actuator 402, first, an electrode film 408 is formed on a substrate 404. The electrode film 408 can be formed by a method such as ion beam, sputtering, vacuum vapor deposition, PVD (physical vapor deposition), ion plating, CVD (chemical vapor deposition), plating, aerosol deposition, screen printing, spray or dipping. Among these, a sputtering method or a screen printing method is preferred in view of bondability between the substrate 404 and the piezoelectric/electrostrictive film 410. The electrode film 408 thus formed can be fixed to the substrate 404 and the piezoelectric/electrostrictive film 410 by a heat treatment.

Subsequently, on the electrode film 408, the piezoelectric/electrostrictive film 410 is formed. The piezoelectric/electrostrictive film 410 can be formed by a method such as ion beam, sputtering, vacuum vapor deposition, PVD, ion plating, CVD, plating, sol-gel, aerosol deposition, screen printing, spray or dipping. Among these, a screen printing method is preferred since the planar shape and the film thickness have high accuracy and a piezoelectric/electrostrictive film can be continuously formed.

Subsequently, on the piezoelectric/electrostrictive film 410, an electrode film 412 is formed. The electrode film 412 can be formed in the same procedure as in the electrode film 408.

Thereafter, the substrate 404 on which the laminate 406 is formed is integrally fired. This firing enables the progress of sintering of the piezoelectric/electrostrictive film 410 and a heat treatment of the electrode films 408 and 412.

It is preferred that the heat treatment of the electrode films 408 and 412 is performed simultaneously with firing in view of the productivity. However, this description does not interfere with the heat treatment carried out for each formation of the electrode films 408 and 412. When firing of the piezoelectric/electrostrictive film 410 is performed prior to the heat treatment of the electrode film 412, the electrode film 412 is subjected to a heat treatment at a temperature lower than the firing temperature of the piezoelectric/electrostrictive film 410.

<3. Third Embodiment>

The third embodiment relates to a structure of a piezoelectric/electrostrictive actuator 502 which can be employed in place of the structure of the piezoelectric/electrostrictive actuator 402 of the second embodiment.

Figure 4:
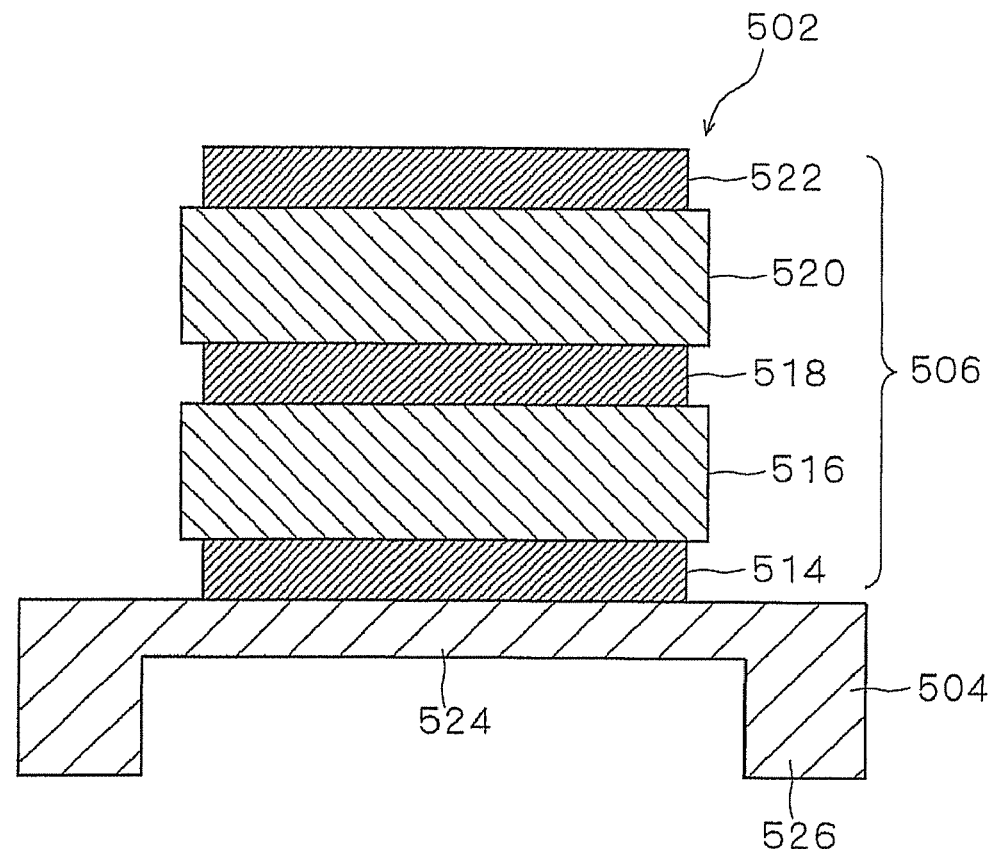
FIG. 4 is a sectional view of a piezoelectric/electrostrictive actuator according to a third embodiment.

FIG. 4 is a schematic view of the piezoelectric/electrostrictive actuator 502 of the third embodiment. FIG. 4 is a sectional view of a multi-layered piezoelectric/electrostrictive actuator 502.

As shown in FIG. 4, the piezoelectric/electrostrictive actuator 502 has a structure in which an electrode film 514, a piezoelectric/electrostrictive film 516, an electrode film 518, a piezoelectric/electrostrictive film 520 and an electrode film 522 are laminated in this order on a top surface of a substrate 504. The electrode films 514 and 518 on both main surfaces of the piezoelectric/electrostrictive film 516 face each other across the piezoelectric/electrostrictive film 516, while the electrode films 518 and 522 on both main surfaces of the piezoelectric/electrostrictive film 520 face each other across the piezoelectric/electrostrictive film 520. A laminate 506 in which the electrode film 514, the piezoelectric/electrostrictive film 516, the electrode film 518, the piezoelectric/electrostrictive film 520 and the electrode film 522 are laminated is fixed to the substrate 504. Although FIG. 4 shows the case where the piezoelectric/electrostrictive film is constituted of two layers, the piezoelectric/electrostrictive film may be constituted of three or more layers.

In the substrate 504 of the multi-layered piezoelectric/electrostrictive actuator 502, the board thickness of a center portion 524 to be bonded with the laminate 506 is smaller than that of a peripheral portion 526 so as to increase the bending displacement while maintaining the mechanical strength of the substrate 504. In the single-layered piezoelectric/electrostrictive actuator 402, the substrate 504 may be used in place of the substrate 404.

The multi-layered piezoelectric/electrostrictive actuator 502 is produced in the same procedure as in the single-layered piezoelectric/electrostrictive actuator 402, except that the numbers of piezoelectric/electrostrictive films and the electrode films to be formed increase.

<4. Fourth Embodiment>

The fourth embodiment relates to a structure of a piezoelectric/electrostrictive actuator 602 which can be employed in place of the structure of the piezoelectric/electrostrictive actuator 402 of the second embodiment.

Figure 5:
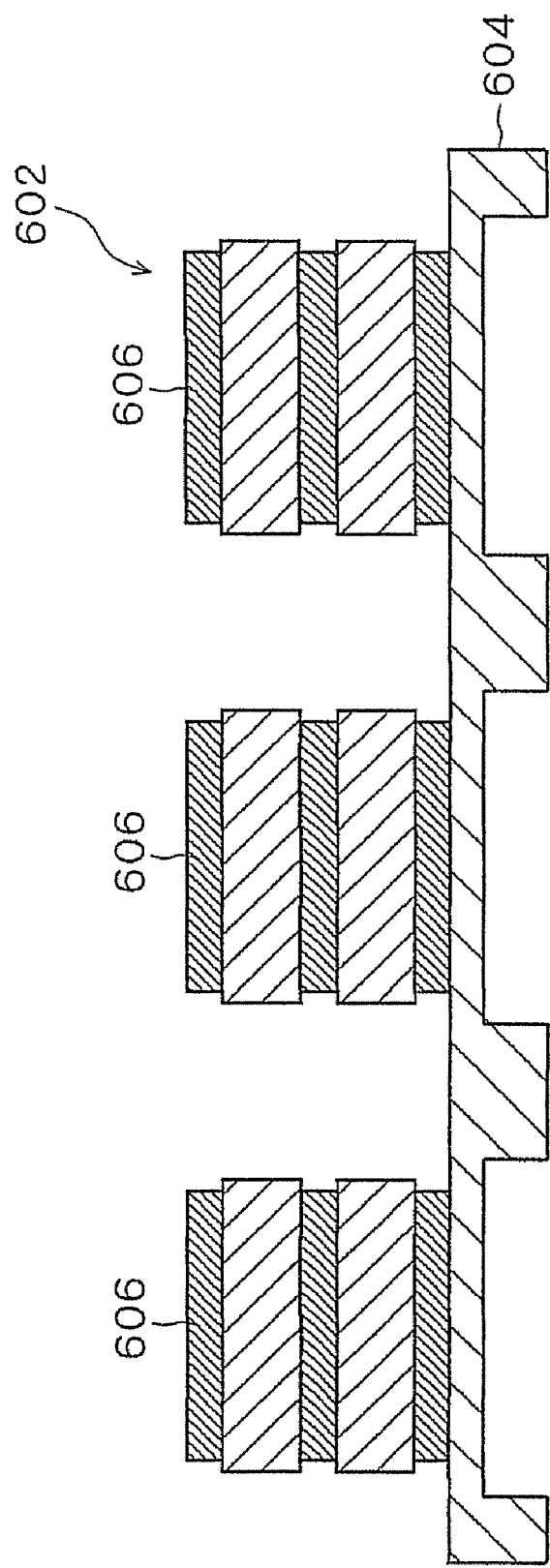
FIG. 5 is a sectional view of a piezoelectric/electrostrictive actuator according to a fourth embodiment.

FIG. 5 is a schematic view of the piezoelectric/electrostrictive actuator 602 of the fourth embodiment. FIG. 5 is a sectional view of the multi-layered piezoelectric/electrostrictive actuator 602.

As shown in FIG. 5, the piezoelectric/electrostrictive actuator 602 includes a substrate 604 in which the substrate 504 shown in FIG. 4 as a unit structure is repeated, and laminates 606 fixed on the unit structures. The laminate 606 is the same as the laminate 506 in the third embodiment.

The piezoelectric/electrostrictive actuator 602 is also produced in the same procedure as in the piezoelectric/electrostrictive actuator 402, except that the numbers of piezoelectric/electrostrictive films and the electrode films to be formed increase and the number of laminates increases.

<5. Fifth Embodiment>

The fifth embodiment relates to a piezoelectric/electrostrictive actuator 702 using the piezoelectric/electrostrictive ceramic sintered body according to the first embodiment.

<5.1 Overall Structure>

Figure 6:
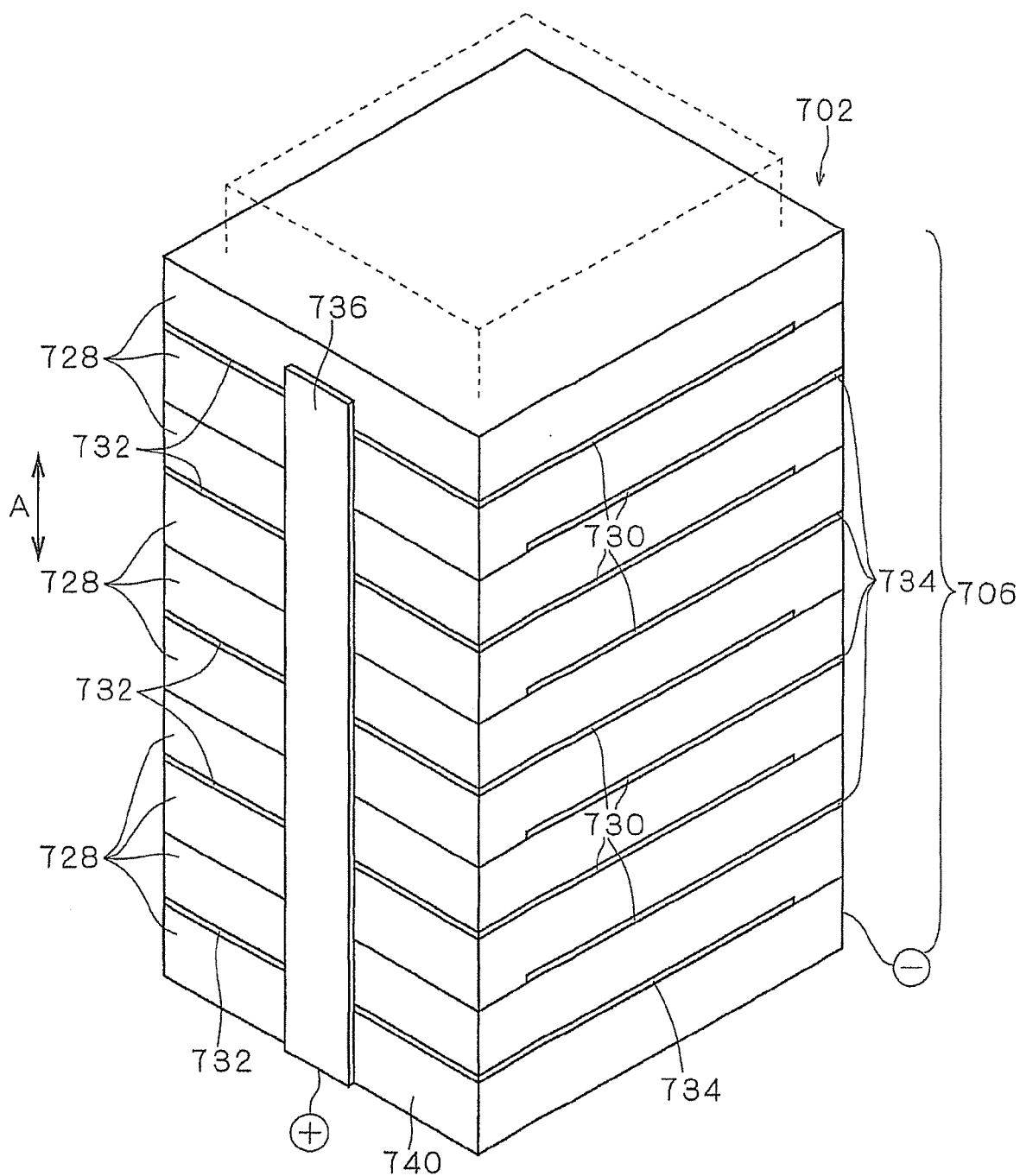
FIG. 6 is a perspective view of a piezoelectric/electrostrictive actuator according to a fifth embodiment.
Figure 7:
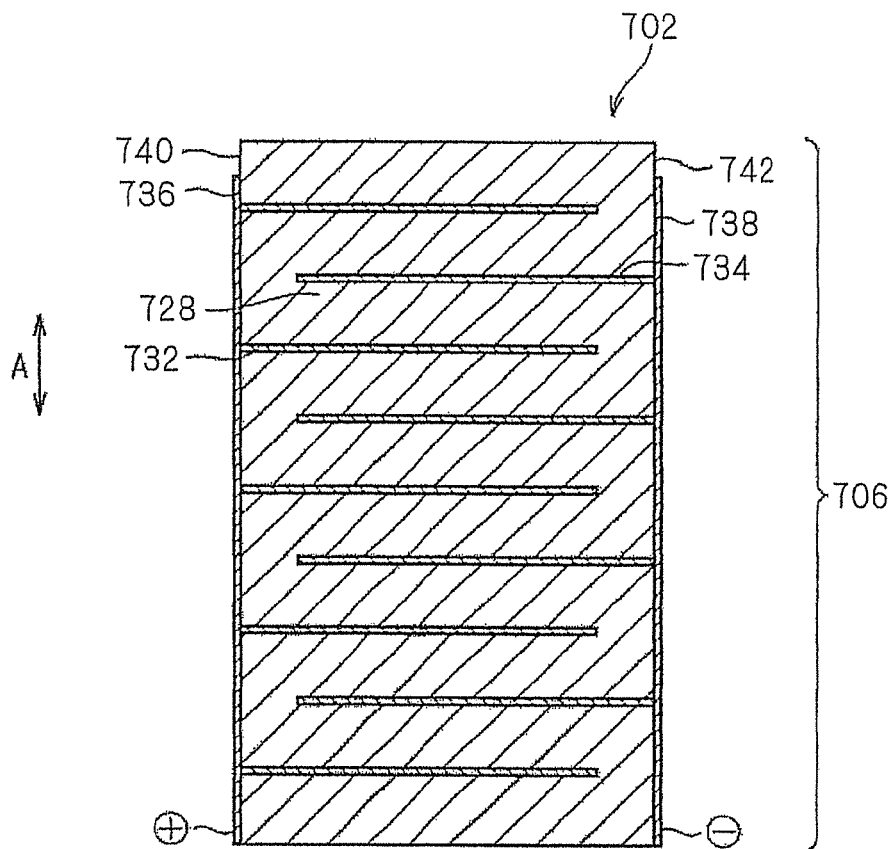
FIG. 7 is a longitudinal sectional view of the piezoelectric/electrostrictive actuator according to the fifth embodiment.
Figure 8:
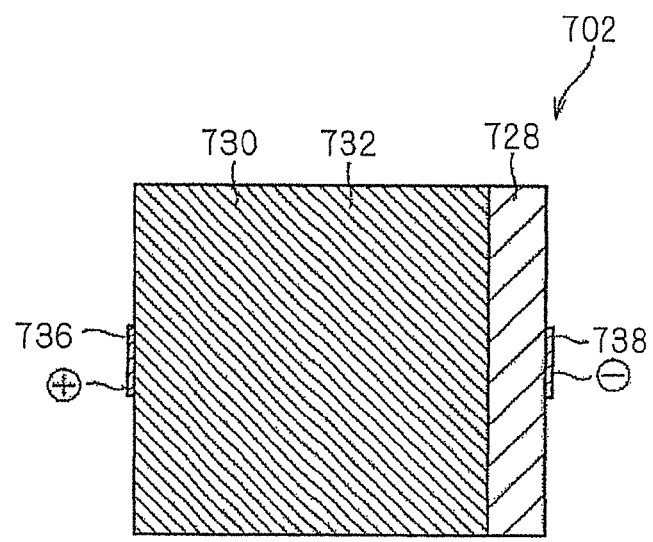
FIG. 8 is a transverse sectional view of the piezoelectric/electrostrictive actuator according to the fifth embodiment.

FIG. 6 to FIG. 8 are schematic views of the piezoelectric/electrostrictive actuator 702. FIG. 6 is a perspective view of the piezoelectric/electrostrictive actuator 702, FIG. 7 is a longitudinal sectional view of the piezoelectric/electrostrictive actuator 702, and FIG. 8 is a transverse sectional view of the piezoelectric/electrostrictive actuator 702.

Figure 9:
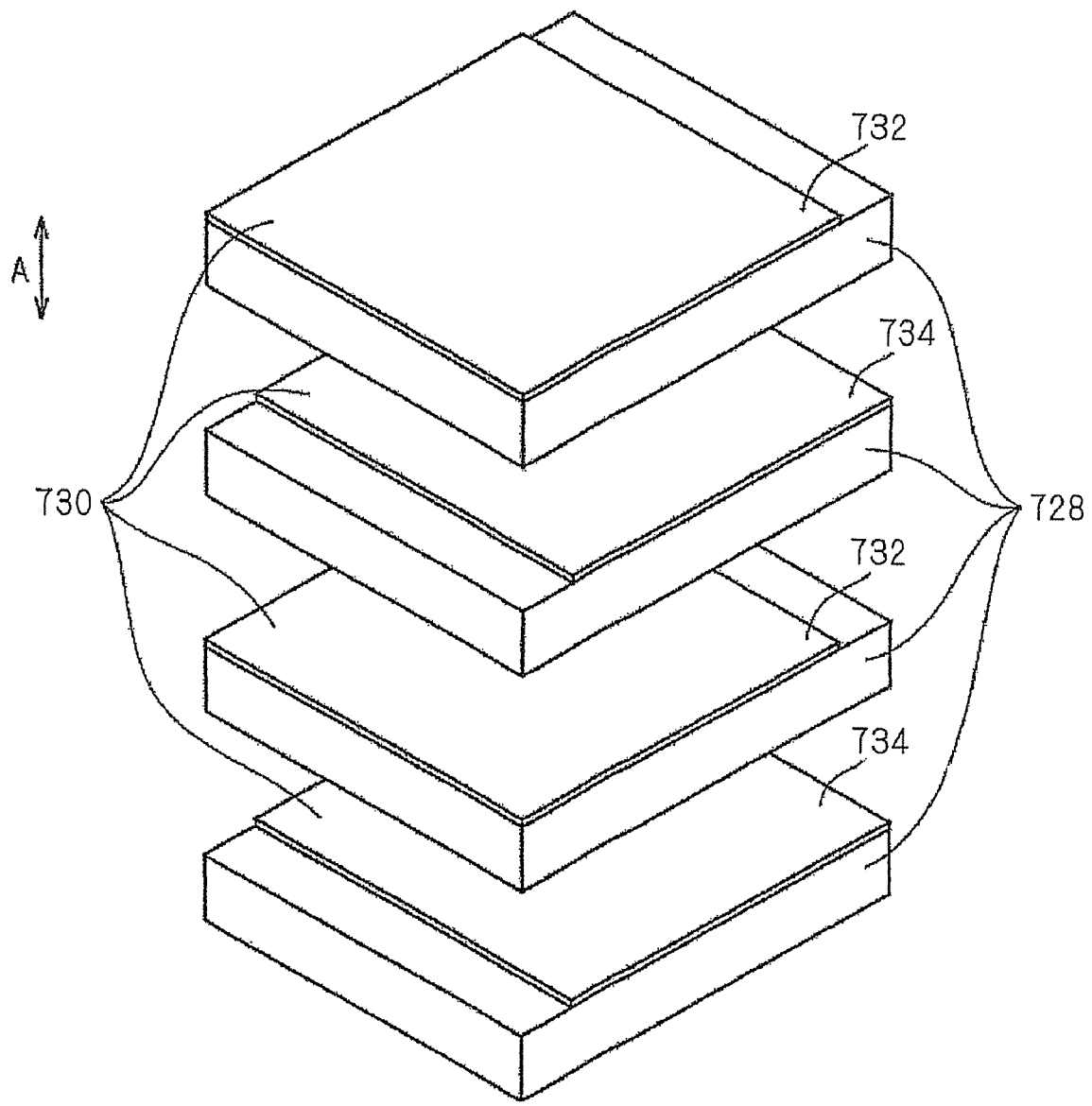
FIG. 9 is an exploded perspective view of a portion of the piezoelectric/electrostrictive actuator according to the fifth embodiment.

As shown in FIG. 6 to FIG. 8, the piezoelectric/electrostrictive actuator 702 has a structure in which a piezoelectric/electrostrictive film 728 and an internal electrode film 730 are alternately laminated in the direction of an axis A, and external electrode films 736 and 738 are respectively formed on end surfaces 740 and 742 of a laminate 706 in which the piezoelectric/electrostrictive film 728 and the internal electrode film 730 are laminated. As shown in an exploded perspective view of FIG. 9 showing a state where a portion of the piezoelectric/electrostrictive actuator 702 is decomposed in the direction of the axis A, the internal electrode film 730 includes a first internal electrode film 732 which reaches the end surface 740 but does not reach the end surface 742, and a second internal electrode film 734 which reaches the end surface 742 but does not reach the end surface 740. The first internal electrode film 732 and the second internal electrode film 734 are alternately provided. The first internal electrode film 732 is contacted with the external electrode film 736 on the end surface 740, and is electrically connected with the external electrode film 736. The second internal electrode film 734 is contacted with the external electrode film 738 at the end surface 742, and is electrically connected with the external electrode film 738. Therefore, when the external electrode film 736 is connected with a plus side of a driving signal source and the external electrode film 738 is connected with a minus side of the driving signal source, a driving signal is applied to the first internal electrode film 732 and the second internal electrode film 734 which face with each other across the piezoelectric/electrostrictive film 728, and an electric field is applied in the thickness direction of the piezoelectric/electrostrictive film 728. As a result, the piezoelectric/electrostrictive film 728 expands and contacts in the thickness direction, and the entire laminate 706 is deformed into the shape indicated by the broken line in FIG. 6.

Unlike the piezoelectric/electrostrictive actuators 402, 502 and 602 which have already been explained, the piezoelectric/electrostrictive actuator 702 does not include a substrate to be fixed with the laminate 706. Since the piezoelectric/electrostrictive actuator 702 is alternately provided with the first internal electrode film 732 and the second internal electrode film 734, each having a different pattern, the actuator is also referred to as an "offset type piezoelectric/electrostrictive actuator."

<5.2 Piezoelectric/Electrostrictive Film 728>

The piezoelectric/electrostrictive film 728 is constituted using the piezoelectric/electrostrictive ceramic sintered body according to the first embodiment. The film thickness of the piezoelectric/electrostrictive film 728 is preferably from 5 to 500 μm. When the film thickness of the piezoelectric/electrostrictive film 728 is smaller than the above range, it becomes difficult to produce the green sheet described later. In contrast, when the film thickness is larger than the above range, it becomes difficult to apply a sufficient electric field to the piezoelectric/electrostrictive film 728.

<5.3 Internal Electrode Film 730 and External Electrode Films 736 and 738>

The material of the internal electrode film 730 and the external electrode films 736 and 738 is a metal such as platinum, palladium, rhodium, gold or silver, or an alloy thereof. Among these materials, the material of the internal electrode film 730 is preferably platinum or an alloy containing platinum as a main component in view of high heat resistance during firing and easy co-sintering with the piezoelectric/electrostrictive film 728. Depending on the firing temperature, an alloy such as silver-palladium can also be suitably used.

The film thickness of the internal electrode film 730 is preferably at most 10 μm. When the film thickness is larger than the above range, the internal electrode film 730 serves as a relaxing layer and the displacement tends to decrease. In order to make the internal electrode film 730 properly fulfill the role, the film thickness is preferably at least 0.1 μm.

Although FIG. 6 to FIG. 8 show a case where the piezoelectric/electrostrictive film 728 is constituted of ten layers, the piezoelectric/electrostrictive film 728 may be constituted of nine or less layers or eleven or more layers.

<5.4 Production of Piezoelectric/Electrostrictive Actuator 702>

In the production of a piezoelectric/electrostrictive actuator 702, first, a binder, a plasticizer, a dispersant and a dispersion medium are added to a piezoelectric/electrostrictive ceramic powder, followed by mixing using a ball mill and so on. The resulting slurry is formed into a sheet by a doctor blade method to obtain a green sheet.

Subsequently, the green sheet is punched using a punch or a die, and the green sheet is provided with a positioning hole and so on.

Furthermore, an electrode paste is applied to a surface of the green sheet by screen printing and so on to obtain a green sheet on which a pattern of the electrode paste is formed. The pattern of the electrode paste includes two kinds of patterns one of which serves as the first internal electrode film 732 after firing and another of which serves as the second internal electrode film 734 after firing. As a matter of course, it is possible to obtain the internal electrode films 732 and 734 after firing by using one kind of a pattern of the electrode paste and alternately rotating the direction of the green sheet by 180°.

Next, the green sheet on which the pattern of the first electrode paste is formed and the green sheet on which the pattern of the second electrode paste is formed are alternately laid one upon another and a green sheet on which the electrode paste is not applied is further laid thereon, and then the green sheets are pressure-welded by pressing in the thickness direction. At this time, the position of the positioning hole formed on the green sheet is adjusted. In the case of pressure welding of the green sheets, the green sheets are preferably pressure-welded while being heated by heating a die to be used for pressure welding.

A laminate 706 can be obtained by firing the thus obtained pressure-welded material of the green sheets and processing the resulting sintered body using a dicing saw and so on. Then, the external electrode films 736 and 738 are formed on the end surfaces 740 and 742 of the laminate 706 by firing, vapor deposition, sputtering and so on.

EXAMPLES

Samples X1 to X16, A1 to A9, B1 to B9, C1 to C9, D1 to D9, E1 to E6, F1 to F6, G1 to G6, H1 to H6, X91 to X93 and G91 to G93 were produced and evaluated. The results will be explained below. Samples X1 to X16, A1 to A9, B1 to B9, C1 to C9, D1 to D9, E1 to E6, F1 to F6, G1 to G6 and H1 to H6 are made of ceramics, while samples X91 to X93 and G91 to G93 are made of a single crystal.

<1. Production of Samples Made of Ceramics>

In the production of samples X1 to X16, A1 to A9, B1 to B9, C1 to C9, D1 to D9, E1 to E6, F1 to F6, G1 to G6 and H1 to H6 made of ceramics, first, $Bi_2O_3$ (bismuth oxide), $TiO_2$ (titanium oxide), $Na_2CO_3$ (sodium carbonate), $K_2CO_3$ (potassium carbonate) and $BaCO_3$ (barium carbonate) as starting materials were weighed so as to obtain the compositions shown in Table 1 to Table 9. The compositions of samples X1 to X16, A1 to A9, B1 to B9, C1 to C9, D1 to D9, E1 to E6, F1 to F6, G1 to G6 and H1 to H6 are compositions represented by the general formula: xBNT-yBKT-zBT (x+y+z=1) wherein Bi, Na and K are allowed to become deficient from stoichiometry in which content ratios x, y and z of BNT, BKT and BT are shown in columns "x", "y" and "z" in Table 1 to Table 9. Stoichiometrically deficient amounts of Bi, Na and K are respectively described in the columns "Bi deficient amount (mol %)", "Na deficient amount (mol %)" and "K deficient amount (mol %)" in Table 1 to Table 9. In the column "amount of vacancies (mol %)" of Table 1 to Table 9, the total of stoichiometrically deficient amounts p, q and r of Bi, Na and K, p+q+r, is described. In a ternary phase diagram of FIG. 1, the point X is a point representing content ratios x, y and z of BNT, BKT and BT of samples X1 to X16 (Table 1), the point A is a point representing content ratios x, y and z of BNT, BKT and BT of samples A1 to A9 (Table 2), the point B is a point representing content ratios x, y and z of BNT, BKT and BT of samples B1 to B9 (Table 3), the point C is a point representing content ratios x, y and z of BNT, BKT and BT of samples C1 to C9 (Table 4), the point D is a point representing content ratios x, y and z of BNT, BKT and BT of samples D1 to D9 (Table 5), the point E is a point representing content ratios x, y and z of BNT, BKT and BT of samples E1 to E6 (Table 6), the point F is a point representing content ratios x, y and z of BNT, BKT and BT of samples F1 to F6 (Table 7), the point G is a point representing content ratios x, y and z of BNT, BKT and BT of samples G1 to G6 (Table 8), and the point H is a point representing content ratios x, y and z of BNT, BKT and BT of samples H1 to H6 (Table 9)

TABLE 1

| Samples | x | y | z | Bi deficient amount (mol %) | Na deficient amount (mol %) | K deficient amount (mol %) | Amount of vacancies (mol %) | Electric field-induced strain (%) | Leak current (A/cm$^2$) |
|---|---|---|---|---|---|---|---|---|---|
| X1 | 0.81 | 0.14 | 0.05 | 0.0 | 0.0 | 0.0 | 0.0 | 0.10 | $10^{-8}$-$10^{-7}$ |
| X2 | 0.81 | 0.14 | 0.05 | 1.0 | 0.0 | 0.0 | 1.0 | 0.12 | $10^{-8}$-$10^{-7}$ |
| X3 | 0.81 | 0.14 | 0.05 | 2.0 | 0.0 | 0.0 | 2.0 | 0.23 | $10^{-8}$-$10^{-7}$ |
| X4 | 0.81 | 0.14 | 0.05 | 4.0 | 0.0 | 0.0 | 4.0 | 0.21 | $10^{-8}$-$10^{-7}$ |
| X5 | 0.81 | 0.14 | 0.05 | 6.0 | 0.0 | 0.0 | 6.0 | 0.22 | $10^{-8}$-$10^{-7}$ |
| X6 | 0.81 | 0.14 | 0.05 | 8.0 | 0.0 | 0.0 | 8.0 | 0.18 | $10^{-8}$-$10^{-7}$ |
| X7 | 0.81 | 0.14 | 0.05 | 10.0 | 0.0 | 0.0 | 10.0 | 0.09 | $10^{-7}$-$10^{-6}$ |
| X8 | 0.81 | 0.14 | 0.05 | 0.0 | 2.0 | 0.0 | 2.0 | 0.27 | $10^{-8}$-$10^{-7}$ |
| X9 | 0.81 | 0.14 | 0.05 | 0.0 | 6.0 | 0.0 | 6.0 | 0.22 | $10^{-8}$-$10^{-7}$ |
| X10 | 0.81 | 0.14 | 0.05 | 0.0 | 8.0 | 0.0 | 8.0 | 0.15 | $10^{-7}$-$10^{-6}$ |
| X11 | 0.81 | 0.14 | 0.05 | 0.0 | 0.0 | 2.0 | 2.0 | 0.25 | $10^{-8}$-$10^{-7}$ |
| X12 | 0.81 | 0.14 | 0.05 | 0.0 | 0.0 | 6.0 | 6.0 | 0.24 | $10^{-8}$-$10^{-7}$ |
| X13 | 0.81 | 0.14 | 0.05 | 0.0 | 0.0 | 8.0 | 8.0 | 0.12 | $10^{-7}$-$10^{-6}$ |
| X14 | 0.81 | 0.14 | 0.05 | 0.0 | 1.0 | 1.0 | 2.0 | 0.23 | $10^{-8}$-$10^{-7}$ |
| X15 | 0.81 | 0.14 | 0.05 | 0.0 | 3.0 | 3.0 | 6.0 | 0.24 | $10^{-8}$-$10^{-7}$ |
| X16 | 0.81 | 0.14 | 0.05 | 0.0 | 4.0 | 4.0 | 8.0 | 0.11 | $10^{-7}$-$10^{-6}$ |

TABLE 2

| Samples | x | y | z | Bi deficient amount (mol %) | Na deficient amount (mol %) | K deficient amount (mol %) | Amount of vacancies (mol %) | Electric field-induced strain (%) | Leak current (A/cm$^2$) |
|---|---|---|---|---|---|---|---|---|---|
| A1 | 0.93 | 0.00 | 0.07 | 2.0 | 0.0 | 0.0 | 2.0 | 0.23 | $10^{-8}$-$10^{-7}$ |
| A2 | 0.93 | 0.00 | 0.07 | 6.0 | 0.0 | 0.0 | 6.0 | 0.21 | $10^{-8}$-$10^{-7}$ |
| A3 | 0.93 | 0.00 | 0.07 | 8.0 | 0.0 | 0.0 | 8.0 | 0.10 | $10^{-8}$-$10^{-7}$ |
| A4 | 0.93 | 0.00 | 0.07 | 0.0 | 2.0 | 0.0 | 2.0 | 0.24 | $10^{-8}$-$10^{-7}$ |
| A5 | 0.93 | 0.00 | 0.07 | 0.0 | 6.0 | 0.0 | 6.0 | 0.22 | $10^{-8}$-$10^{-7}$ |

TABLE 2-continued

| Samples | x | y | z | Bi deficient amount (mol %) | Na deficient amount (mol %) | K deficient amount (mol %) | Amount of vacancies (mol %) | Electric field-induced strain (%) | Leak current (A/cm$^2$) |
|---|---|---|---|---|---|---|---|---|---|
| A6 | 0.93 | 0.00 | 0.07 | 0.0 | 0.0 | 2.0 | 2.0 | 0.25 | $10^{-8}$-$10^{-7}$ |
| A7 | 0.93 | 0.00 | 0.07 | 0.0 | 0.0 | 6.0 | 6.0 | 0.21 | $10^{-8}$-$10^{-7}$ |
| A8 | 0.93 | 0.00 | 0.07 | 0.0 | 1.0 | 1.0 | 2.0 | 0.22 | $10^{-8}$-$10^{-7}$ |
| A9 | 0.93 | 0.00 | 0.07 | 0.0 | 3.0 | 3.0 | 6.0 | 0.20 | $10^{-8}$-$10^{-7}$ |

TABLE 3

| Samples | x | y | z | Bi deficient amount (mol %) | Na deficient amount (mol %) | K deficient amount (mol %) | Amount of vacancies (mol %) | Electric field-induced strain (%) | Leak current (A/cm$^2$) |
|---|---|---|---|---|---|---|---|---|---|
| B1 | 0.86 | 0.00 | 0.14 | 2.0 | 0.0 | 0.0 | 2.0 | 0.20 | $10^{-8}$-$10^{-7}$ |
| B2 | 0.86 | 0.00 | 0.14 | 6.0 | 0.0 | 0.0 | 6.0 | 0.20 | $10^{-8}$-$10^{-7}$ |
| B3 | 0.86 | 0.00 | 0.14 | 8.0 | 0.0 | 0.0 | 8.0 | 0.11 | $10^{-8}$-$10^{-7}$ |
| B4 | 0.86 | 0.00 | 0.14 | 0.0 | 2.0 | 0.0 | 2.0 | 0.23 | $10^{-8}$-$10^{-7}$ |
| B5 | 0.86 | 0.00 | 0.14 | 0.0 | 6.0 | 0.0 | 6.0 | 0.21 | $10^{-8}$-$10^{-7}$ |
| B6 | 0.86 | 0.00 | 0.14 | 0.0 | 0.0 | 2.0 | 2.0 | 0.23 | $10^{-8}$-$10^{-7}$ |
| B7 | 0.86 | 0.00 | 0.14 | 0.0 | 0.0 | 6.0 | 6.0 | 0.20 | $10^{-8}$-$10^{-7}$ |
| B8 | 0.86 | 0.00 | 0.14 | 0.0 | 1.0 | 1.0 | 2.0 | 0.24 | $10^{-8}$-$10^{-7}$ |
| B9 | 0.86 | 0.00 | 0.14 | 0.0 | 3.0 | 3.0 | 6.0 | 0.21 | $10^{-8}$-$10^{-7}$ |

TABLE 4

| Samples | x | y | z | Bi deficient amount (mol %) | Na deficient amount (mol %) | K deficient amount (mol %) | Amount of vacancies (mol %) | Electric field-induced strain (%) | Leak current (A/cm$^2$) |
|---|---|---|---|---|---|---|---|---|---|
| C1 | 0.74 | 0.20 | 0.06 | 2.0 | 0.0 | 0.0 | 2.0 | 0.20 | $10^{-8}$-$10^{-7}$ |
| C2 | 0.74 | 0.20 | 0.06 | 6.0 | 0.0 | 0.0 | 6.0 | 0.21 | $10^{-8}$-$10^{-7}$ |
| C3 | 0.74 | 0.20 | 0.06 | 8.0 | 0.0 | 0.0 | 8.0 | 0.09 | $10^{-8}$-$10^{-7}$ |
| C4 | 0.74 | 0.20 | 0.06 | 0.0 | 2.0 | 0.0 | 2.0 | 0.22 | $10^{-8}$-$10^{-7}$ |
| C5 | 0.74 | 0.20 | 0.06 | 0.0 | 6.0 | 0.0 | 6.0 | 0.21 | $10^{-8}$-$10^{-7}$ |
| C6 | 0.74 | 0.20 | 0.06 | 0.0 | 0.0 | 2.0 | 2.0 | 0.25 | $10^{-8}$-$10^{-7}$ |
| C7 | 0.74 | 0.20 | 0.06 | 0.0 | 0.0 | 6.0 | 6.0 | 0.20 | $10^{-8}$-$10^{-7}$ |
| C8 | 0.74 | 0.20 | 0.06 | 0.0 | 1.0 | 1.0 | 2.0 | 0.24 | $10^{-8}$-$10^{-7}$ |
| C9 | 0.74 | 0.20 | 0.06 | 0.0 | 3.0 | 3.0 | 6.0 | 0.20 | $10^{-8}$-$10^{-7}$ |

TABLE 5

| Samples | x | y | z | Bi deficient amount (mol %) | Na deficient amount (mol %) | K deficient amount (mol %) | Amount of vacancies (mol %) | Electric field-induced strain (%) | Leak current (A/cm$^2$) |
|---|---|---|---|---|---|---|---|---|---|
| D1 | 0.80 | 0.20 | 0.00 | 2.0 | 0.0 | 0.0 | 2.0 | 0.22 | $10^{-8}$-$10^{-7}$ |
| D2 | 0.80 | 0.20 | 0.00 | 6.0 | 0.0 | 0.0 | 6.0 | 0.21 | $10^{-8}$-$10^{-7}$ |
| D3 | 0.80 | 0.20 | 0.00 | 8.0 | 0.0 | 0.0 | 8.0 | 0.12 | $10^{-8}$-$10^{-7}$ |
| D4 | 0.80 | 0.20 | 0.00 | 0.0 | 2.0 | 0.0 | 2.0 | 0.26 | $10^{-8}$-$10^{-7}$ |
| D5 | 0.80 | 0.20 | 0.00 | 0.0 | 6.0 | 0.0 | 6.0 | 0.23 | $10^{-8}$-$10^{-7}$ |
| D6 | 0.80 | 0.20 | 0.00 | 0.0 | 0.0 | 2.0 | 2.0 | 0.27 | $10^{-8}$-$10^{-7}$ |
| D7 | 0.80 | 0.20 | 0.00 | 0.0 | 0.0 | 6.0 | 6.0 | 0.22 | $10^{-8}$-$10^{-7}$ |
| D8 | 0.80 | 0.20 | 0.00 | 0.0 | 1.0 | 1.0 | 2.0 | 0.25 | $10^{-8}$-$10^{-7}$ |
| D9 | 0.80 | 0.20 | 0.00 | 0.0 | 3.0 | 3.0 | 6.0 | 0.20 | $10^{-8}$-$10^{-7}$ |

TABLE 6

| Samples | x | y | z | Bi deficient amount (mol %) | Na deficient amount (mol %) | K deficient amount (mol %) | Amount of vacancies (mol %) | Electric field-induced strain (%) | Leak current (A/cm$^2$) |
|---|---|---|---|---|---|---|---|---|---|
| E1 | 0.98 | 0.00 | 0.02 | 2.0 | 0.0 | 0.0 | 2.0 | 0.05 | $10^{-8}$-$10^{-7}$ |
| E2 | 0.98 | 0.00 | 0.02 | 6.0 | 0.0 | 0.0 | 6.0 | 0.07 | $10^{-7}$-$10^{-6}$ |
| E3 | 0.98 | 0.00 | 0.02 | 0.0 | 2.0 | 0.0 | 2.0 | 0.10 | $10^{-8}$-$10^{-7}$ |
| E4 | 0.98 | 0.00 | 0.02 | 0.0 | 6.0 | 0.0 | 6.0 | 0.05 | $10^{-8}$-$10^{-7}$ |
| E5 | 0.98 | 0.00 | 0.02 | 0.0 | 0.0 | 2.0 | 2.0 | 0.12 | $10^{-8}$-$10^{-7}$ |
| E6 | 0.98 | 0.00 | 0.02 | 0.0 | 0.0 | 6.0 | 6.0 | 0.06 | $10^{-8}$-$10^{-7}$ |

TABLE 7

| Samples | x | y | z | Bi deficient amount (mol %) | Na deficient amount (mol %) | K deficient amount (mol %) | Amount of vacancies (mol %) | Electric field-induced strain (%) | Leak current (A/cm$^2$) |
|---|---|---|---|---|---|---|---|---|---|
| F1 | 0.08 | 0.00 | 0.20 | 2.0 | 0.0 | 0.0 | 2.0 | 0.08 | $10^{-8}$-$10^{-7}$ |
| F2 | 0.08 | 0.00 | 0.20 | 6.0 | 0.0 | 0.0 | 6.0 | 0.10 | $10^{-7}$-$10^{-6}$ |
| F3 | 0.08 | 0.00 | 0.20 | 0.0 | 2.0 | 0.0 | 2.0 | 0.14 | $10^{-8}$-$10^{-7}$ |
| F4 | 0.08 | 0.00 | 0.20 | 0.0 | 6.0 | 0.0 | 6.0 | 0.11 | $10^{-8}$-$10^{-7}$ |
| F5 | 0.08 | 0.00 | 0.20 | 0.0 | 0.0 | 2.0 | 2.0 | 0.13 | $10^{-8}$-$10^{-7}$ |
| F6 | 0.08 | 0.00 | 0.20 | 0.0 | 0.0 | 6.0 | 6.0 | 0.09 | $10^{-8}$-$10^{-7}$ |

TABLE 8

| Samples | x | y | z | Bi deficient amount (mol %) | Na deficient amount (mol %) | K deficient amount (mol %) | Amount of vacancies (mol %) | Electric field-induced strain (%) | Leak current (A/cm$^2$) |
|---|---|---|---|---|---|---|---|---|---|
| G1 | 0.68 | 0.24 | 0.08 | 2.0 | 0.0 | 0.0 | 2.0 | 0.13 | $10^{-7}$-$10^{-6}$ |
| G2 | 0.68 | 0.24 | 0.08 | 6.0 | 0.0 | 0.0 | 6.0 | 0.02 | $10^{-5}$-$10^{-4}$ |
| G3 | 0.68 | 0.24 | 0.08 | 0.0 | 2.0 | 0.0 | 2.0 | 0.09 | $10^{-6}$-$10^{-5}$ |
| G4 | 0.68 | 0.24 | 0.08 | 0.0 | 6.0 | 0.0 | 6.0 | 0.04 | $10^{-6}$-$10^{-5}$ |
| G5 | 0.68 | 0.24 | 0.08 | 0.0 | 0.0 | 2.0 | 2.0 | 0.02 | $10^{-7}$-$10^{-6}$ |
| G6 | 0.68 | 0.24 | 0.08 | 0.0 | 0.0 | 6.0 | 6.0 | 0.10 | $10^{-5}$-$10^{-4}$ |

TABLE 9

| Samples | x | y | z | Bi deficient amount (mol %) | Na deficient amount (mol %) | K deficient amount (mol %) | Amount of vacancies (mol %) | Electric field-induced strain (%) | Leak current (A/cm$^2$) |
|---|---|---|---|---|---|---|---|---|---|
| H1 | 0.76 | 0.24 | 0.00 | 2.0 | 0.0 | 0.0 | 2.0 | 0.10 | $10^{-7}$-$10^{-6}$ |
| H2 | 0.76 | 0.24 | 0.00 | 6.0 | 0.0 | 0.0 | 6.0 | 0.08 | $10^{-6}$-$10^{-5}$ |
| H3 | 0.76 | 0.24 | 0.00 | 0.0 | 2.0 | 0.0 | 2.0 | 0.16 | $10^{-6}$-$10^{-5}$ |
| H4 | 0.76 | 0.24 | 0.00 | 0.0 | 6.0 | 0.0 | 6.0 | 0.06 | $10^{-5}$-$10^{-4}$ |
| H5 | 0.76 | 0.24 | 0.00 | 0.0 | 0.0 | 2.0 | 2.0 | 0.11 | $10^{-6}$-$10^{-5}$ |
| H6 | 0.76 | 0.24 | 0.00 | 0.0 | 0.0 | 6.0 | 6.0 | 0.03 | $10^{-6}$-$10^{-5}$ |

After weighing starting materials, the weighed starting materials, ethanol as a dispersion medium and silicon nitride balls as a milling medium were enclosed in a wide-mouth bottle, and then the starting materials were mixed and pulverized over 1 hour using a planetary ball mill. After completion of mixing and milling, ethanol was removed from the slurry by evaporation and drying.

Subsequently, the mixed materials were calcined at 1000° C. The time of maintaining a maximum temperature was 4 hours.

Subsequently, the calcined materials, ethanol as a dispersion medium and silicon nitride balls as a milling medium were enclosed in a wide-mouth bottle, and then the calcined materials were milled over 1 hour using a planetary ball mill.

Subsequently, a powder was charged in a cylindrical hole having a diameter of 10 mm formed in a mold of a forming machine and then the powder was subjected to a monoaxial pressure forming under a pressure of 15 MPa. Furthermore, the resultant formed body was subjected to CIP forming under a pressure of 100 MPa.

Subsequently, the formed body was fired at 1170° C. The time of maintaining a maximum temperature was 4 hours. The sintered body thus obtained was sliced by a step cutter and then processed into a disk having a thickness of 200 µm.

Finally, a gold electrode film having a thickness of 100 nm was formed on both surfaces of a disk-shaped sintered body by sputtering. The gold electrode film has a circular planar shape and has a diameter of 1 mm.

<2. Evaluation of Samples Made of Ceramics>

The electric field-induced strain and the leak current of samples X1 to X16, A1 to A9, B1 to B9, C1 to C9, D1 to D9, E1 to E6, F1 to F6, G1 to G6 and H1 to H6, which are made of ceramics, were measured. The results are shown in Table 1 to Table 9. The electric field-induced strain was measured by using a ferroelectric substance evaluation system 6252 Rev. B manufactured by TOYO Corporation. The electric field-induced strain is an elongation percentage in the thickness direction when an AC electric field is applied to a disk-shaped sintered body in the thickness direction. The amplitude of the applied AC electric field is 100 kV/cm, and the frequency is 0.5 Hz. The leak current is the value when the relaxing time is 30 seconds.

As shown in Table 1 to Table 5, in samples X3 to X5, X8, X9, X11, X12, X14, X15, A1, A2, A4 to A9, B1, B2, B4 to B9, C1, C2, C4 to C9, D1, D2, and D4 to D9 in which the content ratios x, y and z of BNT, BKT and BT are within the above range and the amount of vacancies was adjusted to 2.0 to 6.0 mol %, regardless of A-site elements to be allowed to become deficient from stoichiometry, the samples showed an electric field-induced strain of 0.2% or more.

As shown in Table 6 to Table 9, in samples E1 to E6, F1 to F6, G1 to G6, and H1 to H6 in which content ratios x, y and z of BNT, BKT and BT are not within the above range, regardless of the amount of vacancies within a range from 2.0 to 6.0 mol %, the electric field-induced strain became less than 0.2%. In some of samples G1 to G6 and H1 to H6, the leak current increased.

As shown in Table 1, in samples X1 and X2 in which the amount of vacancies was decreased to less than 2.0 mol %, regardless of content ratios x, y and z of BNT, BKT and BT within the above range, the electric field-induced strain was less than 0.2%.

As shown in Table 1 to Table 5, in samples X6, X7, X10, X13, X16, A3, B3, C3 and D3 in which the amount of vacancies is more than 6 mol %, regardless of content ratios x, y and z of BNT, BKT and BT within the above range, the electric field-induced strain was less than 0.2% and the leak current increased in some cases. X-ray diffraction analysis of the sintered body of sample X7 revealed the existence of a heterophase to be identified as $Bi_4Ti_3O_{12}$.

FIG. 10 and FIG. 11 are graphs showing a polarization change to the electric field when an AC electric field is applied to samples X1 and X3, respectively. As is apparent from a comparison between FIG. 10 and FIG. 11, in sample X3 including A-site vacancies, the polarization quickly changed at around the portion indicated by the arrow and a hysteresis loop close to that of an antiferroelectric substance was observed.

Figure 12:
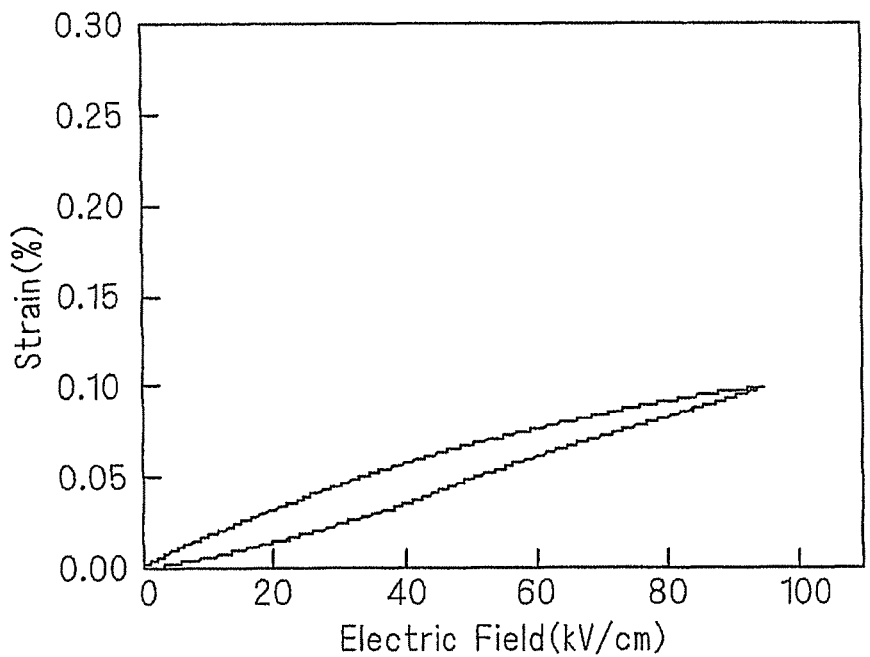
FIG. 12 is a graph showing a strain change to an electric field when an AC electric field is applied to the sample X1.
Figure 13:
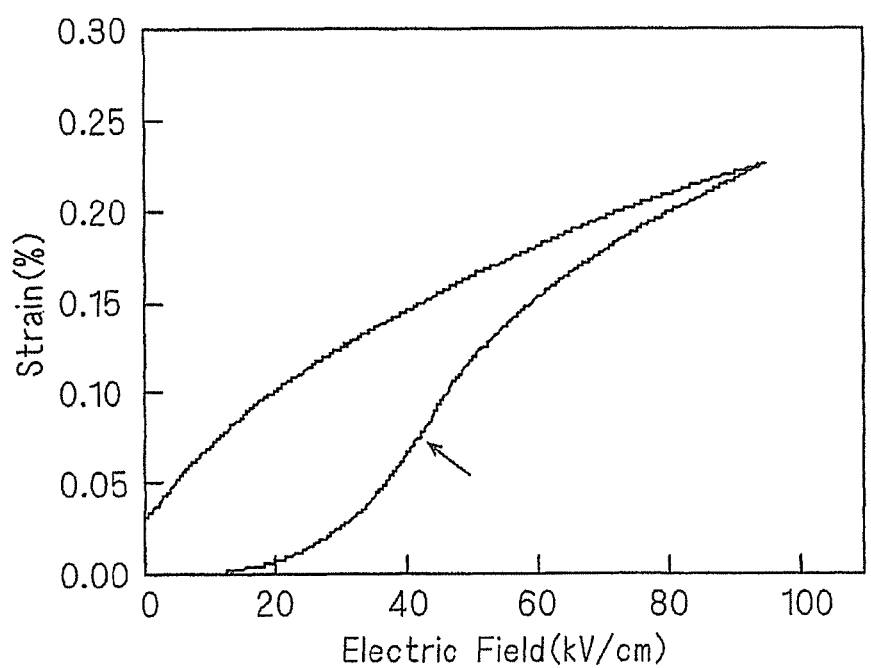
FIG. 13 is a graph showing a strain change to an electric field when an AC electric field is applied to the sample X3.

FIG. 12 and FIG. 13 are graphs showing a strain change to the electric field when an AC electric field is applied to samples X1 and X3, respectively. As is apparent from a comparison between FIG. 12 and FIG. 13, in sample X3 including A-site vacancies, the strain quickly changed at around the portion indicated by the arrow.

The grain size of the sintered body of samples X1 to X16, A1 to A9, B1 to B9, C1 to C9, D1 to D9, E1 to E6, F1 to F6, G1 to G6 and H1 to H6, which are made of ceramics, was calculated from an electron micrograph of the polished surface by a line intercept method. As a result, the grain size was from 0.5 to 5 μm.

<3. Production of Samples Made of Single Crystal>

In the production of samples X91 to X93 and G91 to G93 which are made of a single crystal, the single crystal was grown by a self-flux method.

In the production of samples X91 to X93 and G91 to G93 which are made of a single crystal, first, powders of a polycrystal with the compositions shown in Table 10 and Table 11 were produced in the same procedure as in samples made of ceramics. The compositions of samples X91 to X93 and G91 to G93 are represented by the general formula: xBNT-yBKT-zBT (x+y+z=1) wherein Bi, Na and K are allowed to become deficient from stoichiometry in which content ratios x, y and z of BNT, BKT and BT are shown in columns "X", "y" and "z" in Table 10 and Table 11. Stoichiometrically deficient amounts of Bi, Na and K are respectively described in the columns "Bi deficient amount (mol %)", "Na deficient amount (mol %)" and "K deficient amount (mol %)" in Table 10 and Table 11. In the column "amount of vacancies (mol %)" of Table 10 and Table 11, the total of stoichiometrically deficient amounts of Bi, Na and K is described. In the ternary phase diagram of FIG. 1, the point X is a point representing content ratios x, y and z of BNT, BKT and BT of samples X91 to X93 (Table 10) and the point G is a point representing content ratios x, y and z of BNT, BKT and BT of samples G91 to G93 (Table 11).

After producing powders of a polycrystal, a mixture of a flux and each powder of a polycrystal thus obtained was charged in a platinum crucible and, after closing the crucible with a platinum lid, the mixture was heated to 1300° C. and then melted by maintaining the state of 1300° C. for 5 hours. The melt was slowly cooled to obtain a single crystal. As the flux, $Bi_2O_3$ with a purity of 99.9999% was used.

Subsequently, the resulting single crystal was treated with 10% by weight of nitric acid, thereby dissolving the adhered flux. Then, the single crystal was washed with pure water.

The single crystal was washed with pure water and was annealed under an air atmosphere at 950° C. over 10 hours to obtain samples X91 to X93 and G91 to G93.

<4. Evaluation of Samples Made of Single Crystal>

Subsequently, the charge-induced strain and the leak current of samples X91 to X93 and G91 to G93 were measured in the same procedure as in samples X1 to X16, A1 to A9, B1 to B9, C1 to C9, D1 to D9, E1 to E6, F1 to F6, G1 to G6 and H1 to H6. The results are shown in Table 10 and Table 11.

TABLE 10

| Samples | x | y | z | Bi deficient amount (mol %) | Na deficient amount (mol %) | K deficient amount (mol %) | Amount of vacancies (mol %) | Electric field-induced strain (%) | Leak current (A/cm$^2$) |
|---|---|---|---|---|---|---|---|---|---|
| X91 | 0.81 | 0.14 | 0.05 | 2.0 | 0.0 | 0.0 | 2.0 | 0.43 | $10^{-8}$-$10^{-7}$ |
| X92 | 0.81 | 0.14 | 0.05 | 0.0 | 2.0 | 0.0 | 2.0 | 0.25 | $10^{-8}$-$10^{-7}$ |
| X93 | 0.81 | 0.14 | 0.05 | 0.0 | 0.0 | 2.0 | 2.0 | 0.18 | $10^{-8}$-$10^{-7}$ |

TABLE 11

| Samples | x | y | z | Bi deficient amount (mol %) | Na deficient amount (mol %) | K deficient amount (mol %) | Amount of vacancies (mol %) | Electric field-induced strain (%) | Leak current (A/cm$^2$) |
|---|---|---|---|---|---|---|---|---|---|
| G91 | 0.68 | 0.24 | 0.08 | 2.0 | 0.0 | 0.0 | 2.0 | 0.82 | $10^{-8}$-$10^{-7}$ |
| G92 | 0.68 | 0.24 | 0.08 | 0.0 | 2.0 | 0.0 | 2.0 | 0.67 | $10^{-8}$-$10^{-7}$ |
| G93 | 0.68 | 0.24 | 0.08 | 0.0 | 0.0 | 2.0 | 2.0 | 0.55 | $10^{-8}$-$10^{-7}$ |

In the case of ceramics, the electric field-induced strain tends to increase toward the point X from the point G in the ternary phase diagram of FIG. 1. In contrast, in the case of the single crystal, the electric field-induced strain tends to increase toward the point G from the point X in the ternary phase diagram of FIG. 1.

The composition is quantitatively determined by ICP (inductively coupled plasma) atomic emission spectrometry. The contents of Bi and Ti are more accurately determined by a wet chemical analysis method such as a weight method or a titration method.

While the present invention has been described in detail, the description is intended to be illustrative in all aspects and should not be taken to be limiting. Non-exemplified numerous variations can be made without department from the scope of the invention.

DESCRIPTION OF REFERENCE NUMERALS USED IN THE DRAWINGS

402, 502, 602, 702: Piezoelectric/electrostrictive actuator
410, 516, 520: Piezoelectric/electrostrictive film
728: Piezoelectric/electrostrictive film
408, 412, 514, 518, 522, 730: Electrode film

The invention claimed is:

1. A piezoelectric/electrostrictive ceramic composition having a composition represented by the general formula: $x(Bi_{1/2}Na_{1/2})TiO_3$-$y(Bi_{1/2}K_{1/2})TiO_3$-$zBaTiO_3$, wherein $x+y+z=1$, and wherein at least one kind among Bi, Na and K as A-site elements is allowed to become deficient from stoichiometry in which a point (x, y, z) representing content ratios x, y and z of $(Bi_{1/2}Na_{1/2})TiO_3$, $(Bi_{1/2}K_{1/2})TiO_3$ and $BaTiO_3$ is within a range including a border line of a quadrangle ABCD with a point A (x=0.93, y=0, z=0.07), a point B (x=0.86, y=0, z=0.14), a point C (x=0.74, y=0.20, z=0.06) and a point D (x=0.80, y=0.20, z=0.00) as vertices in a ternary phase diagram, and thus a stoichiometrically deficient amount of the A-site elements is adjusted to at least 2 mol % to at most 6 mol %.

2. A sintered body of piezoelectric/electrostrictive ceramics having a composition represented by the general formula: $x(Bi_{1/2}Na_{1/2})TiO_3$-$y(Bi_{1/2}K_{1/2})TiO_3$-$zBaTiO_3$, wherein $x+y+z=1$, and wherein vacancies are formed in an A-site of a solid solution having a perovskite structure in which a point (x, y, z) representing content ratios x, y and z of $(Bi_{1/2}Na_{1/2})TiO_3$, $(Bi_{1/2}K_{1/2})TiO_3$ and $BaTiO_3$ is within a range including a border line of a quadrangle ABCD with a point A (x=0.93, y=0, z=0.07), a point B (x=0.86, y=0, z=0.14), a point C (x=0.74, y=0.20, z=0.06) and a point D (x=0.80, y=0.20, z=0.00) as vertices in a ternary phase diagram, and thus an amount of the A-site vacancies is adjusted to at least 2 mol % to at most 6 mol %.

3. A piezoelectric/electrostrictive element comprising:
a sintered body of piezoelectric/electrostrictive ceramics; and
electrodes facing each other across said sintered body;
wherein said sintered body has a composition represented by the general formula: $x(Bi_{1/2}Na_{1/2})TiO_3$-$y(Bi_{1/2}K_{1/2})TiO_3$-$zBaTiO_3$, wherein $x+y+z=1$, and wherein vacancies are formed in an A-site of a solid solution having a perovskite structure in which a point (x, y, z) representing content ratios x, y and z of $(Bi_{1/2}Na_{1/2})TiO_3$, $(Bi_{1/2}K_{1/2})TiO_3$ and $BaTiO_3$ is within a range including a border line of a quadrangle ABCD with a point A (x=0.93, y=0, z=0.07), a point B (x=0.86, y=0, z=0.14), a point C (x=0.74, y=0.20, z=0.06) and a point D (x=0.80, y=0.20, z=0.00) as vertices in a ternary phase diagram, so that an amount of the A-site vacancies is adjusted to at least 2 mol % to at most 6 mol %.

4. A method for producing a piezoelectric/electrostrictive ceramic composition, comprising:
a step of mixing starting materials with the composition represented by the general formula $x(Bi_{1/2}Na_{1/2})TiO_3$-$y(Bi_{1/2}K_{1/2})TiO_3$-$zBaTiO_3$, wherein $x+y+z=1$, so that at least one kind among Bi, Na and K as A-site elements is allowed to become deficient from stoichiometry in which a point (x, y, z) representing content ratios x, y and z of $(Bi_{1/2}Na_{1/2})TiO_3$, $(Bi_{1/2}K_{1/2})TiO_3$ and $BaTiO_3$ is within a range including a border line of a quadrangle ABCD with a point A (x=0.93, y=0, z=0.07), a point B (x=0.86, y=0, z=0.14), a point C (x=0.74, y=0.20, z=0.06) and a point D (x=0.80, y=0.20, z=0.00) as vertices in a ternary phase diagram, and thus a stoichiometrically deficient amount of the A-site elements is adjusted to at least 2 mol % to at most 6 mol %; and
a step of reacting the starting materials mixed in said mixing step.

5. A method for producing a piezoelectric/electrostrictive element, comprising:
a step of producing a sintered body of piezoelectric/electrostrictive ceramics with the composition represented by the general formula $x(Bi_{1/2}Na_{1/2})TiO_3$-$y(Bi_{1/2}K_{1/2})TiO_3$-$zBaTiO_3$, wherein $x+y+z=1$ and wherein vacancies are formed in an A-site of a solid solution having a perovskite structure in which a point (x, y, z) representing content ratios x, y and z of $(Bi_{1/2}, Na_{1/2})TiO_3$, $(Bi_{1/2}K_{1/2})TiO_3$ and $BaTiO_3$ is within a range including a border line of a quadrangle ABCD with a point A (x=0.93, y=0, z=0.07), a point B (x=0.86, y=0, z=0.14), a point C (x=0.74, y=0.20, z=0.06) and a point D (x=0.80, y=0.20, z=0.00) as vertices in a ternary phase diagram, so that an amount of the A-site vacancies is adjusted to at least 2 mol % to at most 6 mol %; and
a step of producing electrodes facing each other across said sintered body.

* * * * *

UNITED STATES PATENT AND TRADEMARK OFFICE
CERTIFICATE OF CORRECTION

PATENT NO.       : 8,269,402 B2
APPLICATION NO.  : 12/618925
DATED            : September 18, 2012
INVENTOR(S)      : Hirofumi Yamaguchi et al.

Page 1 of 1

It is certified that error appears in the above-identified patent and that said Letters Patent is hereby corrected as shown below:

Column 3

Line 42: please change "FIG. 1l" to --FIG. 11--.

Column 20, line 54

(claim 5), line 42: please change "($Bi_{1/2}$, $Na_{1/2}$)" to --($Bi_{1/2}$ $Na_{1/2}$)--.

Signed and Sealed this
Fourth Day of December, 2012

David J. Kappos
*Director of the United States Patent and Trademark Office*